United States Patent
Choi et al.

(10) Patent No.: US 7,298,655 B2
(45) Date of Patent: Nov. 20, 2007

(54) ISOLATION CONTROL CIRCUIT AND METHOD FOR A MEMORY DEVICE

(75) Inventors: Jong-Hyun Choi, Suwon-si (KR); Young-Sun Min, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 71 days.

(21) Appl. No.: 11/073,765

(22) Filed: Mar. 8, 2005

(65) Prior Publication Data

US 2006/0007753 A1 Jan. 12, 2006

(30) Foreign Application Priority Data

Jul. 8, 2004 (KR) .................. 10-2004-0053132

(51) Int. Cl.
*G11C 16/04* (2006.01)
(52) U.S. Cl. .................. 365/189.01; 365/230.03; 365/203; 365/205
(58) Field of Classification Search .......... 365/189.01, 365/130.03, 203, 205, 230.03
See application file for complete search history.

(56) References Cited

U.S. PATENT DOCUMENTS

| | | | | |
|---|---|---|---|---|
| 5,553,028 A | * | 9/1996 | McLaury | 365/205 |
| 6,023,437 A | * | 2/2000 | Lee | 365/203 |
| 6,118,713 A | | 9/2000 | Raad | |
| 6,230,292 B1 | * | 5/2001 | Duesman et al. | 714/718 |
| 6,549,480 B2 | * | 4/2003 | Hosogane et al. | 365/226 |
| 6,600,684 B2 | | 7/2003 | Satani et al. | |

* cited by examiner

*Primary Examiner*—David Lam
(74) *Attorney, Agent, or Firm*—Volentine & Whitt, PLLC

(57) ABSTRACT

A semiconductor memory includes a memory cell array, a sense amplifier, an isolation device interposed between the sense amplifier and a bit line of the memory cell array, and circuitry for transferring a charge contained in a memory cell of memory cell array to the bit line while the isolation device electrically isolates the bit line from the sense amplifier, and, after the charge is transferred to the bit line, for causing the isolation device to electrically connect the bit line to the sense amplifier.

26 Claims, 18 Drawing Sheets

| PBLOCK1 | PBLOCK2 | PISOL | PISOR |
|---------|---------|-------|-------|
| L | L | VCC | VCC |
| L | H | VSS | VPP |
| H | L | VPP | VSS |
| H | H | -- | -- |

Fig. 14

| CON0 | |
|---|---|
| L | H |
| Normal Operational Mode | Externally Controlled Operational Mode |

Fig. 15

| CON0 | CON1 | CON2 | |
|---|---|---|---|
| L | H | H | Normal ISO Operation |
| H | L | H | PISOL enable |
| H | H | L | PISOR enable |
| H | L | L | NA |
| H | H | H | NA |

ISOLATION CONTROL CIRCUIT AND METHOD FOR A MEMORY DEVICE

BACKGROUND OF THE INVENTION

1. Field of the Invention

The present invention generally relates to memory circuits, and more particularly, the present invention relates circuits and methods for isolating memory cells of a memory device.

2. Description of the Related Art

A conventional memory device, such as a dynamic random access memory (DRAM) device, is schematically illustrated in FIG. 1. As shown, a plurality of memory cell arrays 10 and sense amplifiers 20 are alternately arranged. Each memory cell array 10 is associated with a row decoder 30 which generates word line signals (WL) for selection of word lines of the corresponding memory cell array 10. Likewise, a column decoder 50 generates column select signals (CSL) for selection of bits lines of the memory cells arrays 10. Also, as shown, each sense amplifier 20 is controlled by control signals (CONTROL) generated by respective a control circuit 40.

The memory device of FIG. 1 is characterized by the sharing of each sense amplifier 20 between two adjacent memory cell arrays 10. Isolation circuitry contained in each sense amplifier 20 is utilized to isolate one of the adjacent memory cell arrays 10 while the sense amplifier 20 is being used in conjunction with the other of adjacent memory cell arrays. This is explained in more detail with reference to the circuit diagram of FIG. 2.

Referring to FIG. 2, a sense amplifier region is operatively connected between a first memory cell array block 1 (BLOCK1) and a second memory cell array block 2 (BLOCK2). Each block contains complimentary memory cells C0 and C1 connected between source voltage VP and complimentary bit lines BLn and BLBn (where n=0, 1, 2, . . . ), respectively. A column decoder 50 receives a pre-decoded column address signal DCA and generates corresponding column select signals CSLn for selection of the complimentary bit lines BLn and BLBn. Also, as shown, the complimentary memory cells C0 and C1 are respectively read/write enabled by word lines WL0 and WL1 (or word lines WL510 and 511), which in turn are connected to a row decoder 30 which decodes pre-decoded row address signals DRA. As one skilled in the art will appreciate, FIG. 2 only shows a small portion of a typical memory block, and in reality each memory block includes numerous pairs of word lines and bit lines connected to numerous pairs of complimentary memory cells.

The sense amplifier region of FIG. 2 includes equalization transistors E1, E2 and E3 which form an equalization circuit connected as shown between each pair of bit lines BL0 and BLB0. This equalization circuit is responsive to an equalization control signal PEQL (or PEQR) generated by an equalization control signal generator 41 (PEQL GEN. and PEQR GEN.) to equalize, or pre-charge, the bit lines BL0 and BLB0 to VCC/2 (=VBL). Generally, this is done prior to accessing (e.g., reading) the memory cells connected to the bit lines.

Transistors P1, P2 and N1, N2 are connected as shown to form a sense amplifier which functions in a well know manner to amplify a voltage differential across the bit lines BL0 and BLB0. The sense amplifier is enabled by sense enable voltages LA and LAB generated by amplification voltage generators 43 and 44 (LA GEN. and LAB GEN.).

Transistors S1 and S2 are isolation transistors which are responsive to isolation control signals PISOL and PISOR generated by an isolation control signal generator 42 (PISOL GEN. and PISOR GEN.) in response to block selection signals PBLOCK1 and PBLOCK2. The isolation transistors S1 and S2 are controlled to selectively isolate one of the blocks 1 or 2 while the sense amplifier is being used for the other of the blocks 1 or 2.

Transistors L1 and L2 are column select transistors which are used to selectively couple the bit lines BL0 and BLB0 to input/output lines IO and IOB, respectively. These transistors L1 and L2 are activated in response to the column select signals generated by the column decoder 50. For example, column select signal CSL0 controls coupling of the bit lines BL0 and BLB0 to the input/output lines IO and IOB, column select signal CSL1 controls coupling of the bit lines BL1 and BLB1 to the input/output lines IO and IOB, and so on.

FIG. 3 is a block diagram for explaining the generation of the word line signals WL and the column select signals CSL. Externally supplied command and address signals are applied to terminals of the memory device as shown. A command decoder 60 is response to the command signals to generate a row access master signal PR and a column access master signal PC. An address buffer 70 receives the externally supplied address, and outputs a row address RA and a column address CA according to the externally supplied address and the row and column access master signals PR and PC. Pre-decoders 80 and 85 convert the row and column address signals RA and CA to pre-decoded row and column address signals DRA and DCA, respectively. These pre-decoded signals are then decoded by main decoders 90 and 95 to generate the word line signal WL and the column select signal CSL, respectively.

FIG. 4 is a schematic block diagram showing the generation of the isolation control signals, the equalization signals, and the sense enable signals of the memory device shown in FIG. 2. As described above in connection with FIG. 3, the pre-decoder 80 outputs pre-decoded row address signals DRA. Bits DRAij of the pre-decoded row address signal DRA are applied to the main decoder 90 which, as described above, outputs a corresponding word line signal WL. The remaining bits DRAkl of the pre-decoded row address signal DRA (typically, the most-significant bits of DRA) are used for block selection and applied to the block generator 100. The block generator 100 outputs a block selection signal PBLOCK1,2 which is indicative of one of the two memory array blocks 1 and 2 of the memory device. Although two blocks are described in this example, the memory device may include many more memory array blocks (e.g., 16 or more).

Still referring also to FIG. 4, the isolation control signal generator 42 controls isolation control signals PISOL and PISOR in accordance with the block selection signal PBLOCK1,2. Likewise, the equalization control signal generator 41 controls equalization control signals PEQL and PEQR in accordance with the block selection signal PBBLOCK1,2.

Meanwhile, the sense control circuit 110 of FIG. 4 outputs a sense enable master signal PS in accordance with the row access master signal PR (see FIG. 3) and the row address signal bits DRAij or DRAkl. The sense enable master signal PS is received by sense amplifier control circuits 120 and 130, which respectively output sense amplifier control signals PS_PSA and PS_NSA. These control signals PS_PSA and PS_NSA are used to respectively control the voltage level of the sense enable voltages LA and LAB illustrated in FIG. 2 (see, e.g., FIG. 9 discussed below).

FIG. 5 is an exemplary circuit diagram of the isolation control circuit generator 42 illustrated in FIG. 4, and FIG. 6 is a logic table of the same. Generally, at least one of the block signals PBLOCK1 and PBLOCK2 is isolation enabled (Low) at all times. Here, isolation enabled means that the corresponding memory block is isolated from the sense amplifier. As is apparent from FIG. 5, and as shown in the table of FIG. 6, when PBLOCK1 is enabled (Low) and PBLOCK2 is non-enabled (High), isolation signal PISOL becomes VSS (Low) and isolation signal PISOR becomes VPP (High). As such, referring to FIG. 2, the cell array block 1 is isolated from the sense amplifier circuitry, while cell array block 2 is coupled to the sense amplifier circuitry. In contrast, when PBLOCK1 is non-enabled (High) and PBLOCK2 is enabled (Low), isolation signal PISOL becomes VPP (High) and isolation signal PISOR becomes VSS (Low). Thus, the cell array block 1 becomes coupled to the sense amplifier circuitry, and cell array block 2 is isolated from the sense amplifier circuitry. When both PBLOCK1 and PBLOCK2 are non-enabled (Low), for example during a standby mode, then the circuit block identified by reference number 150 functions to pre-charged and equalized PISOL and PISOR to voltage VCC.

FIG. 7 is a simplified circuit diagram for explaining a charge sharing operation of a conventional memory device. The bit lines BL and BLB of the device include pre-charged capacitors CBL_CELL and CBL_SA (CBLB_CELL and CBLB_SA). As examples, CBL_CELL is about 3 times the size of CCELL of the memory cell, and CBL_CELL is greater than the size of CBL_SA of the sense amplifier. In operation, assume the capacitor of memory cell C0 contains a data "1". When the word line WL is enabled, the charges stored in the various capacitors of bit line BL are "shared" as depicted by the two-headed arrow. The result is a small increase (e.g., 100 mV or more) in the voltage of bit line BL which is to be detected by the sense amplifier.

FIG. 8 is a timing diagram of the charge sharing operation of the circuit of FIG. 5, again in the case where cell C0 contains data "1". In an isolation (ISO) activation period, isolation control signal PISOL is increased from VCC to VPP, and isolation control signal PISOR is decreased from VCC to VSS. At the end of the ISO activation period, the voltage of word line WL is increased from VSS to VPP. As such, the capacitor CCELL becomes coupled to the bit line BL, and the resultant charge sharing operation causes the voltage of bit line BL to increase from VBL to VBL+ΔVBL. Note that the voltage of bit line BLB remains at VBL.

In order to speed up the bit line sense operation, it is generally necessary to lower the threshold voltages of the sense amplifier transistors. However, a trade-off situation arises in that lower threshold voltages result in increased leakage current, which in turn reduces an effective sense interval of the sense operation. The dashed lines shown in the circuit diagram of FIG. 9 depict sense amplifier leakage current paths in the case where bit line BL is at voltage VBL+ΔVBL, and bit line BLB is at voltage VBL. The result of this leakage is illustrated in FIG. 10. After the charge sharing operation which follows activation of the isolation control signal PISO, the voltage level of bit line BL gradually decreases as a result of the sense amplifier leakage. The line identified by circle-2 of the figure shows the bit line voltage characteristic in the case where the VCC voltage (i.e., the sense amplifier transistor thresholds) is reduced relative to that of the line identified by circle-1 of the figure. The leakage is more pronounced at lower thresholds, and accordingly, the voltage drop is more rapid. As shown, the result is a significantly reduced sensing interval. As the trend in the industry is for lower and lower VCC operating voltages, sense amplifier leakage is becoming increasingly problematic.

In the meantime, a number of bit line bridge defects tend to occur in the manufacture of the memory device. Turning now to FIG. 12, these defects are generally of two types. The first type (circle-1) results from a short or leakage between bit lines of the same bit line pair (e.g., BL0 and BLB0). The second type (circle-2) results from a short or leakage between bit lines of adjacent bit line pairs (e.g., BLB0 and BL1). As is schematically shown, the bit lines of the memory cell array are packed more densely than those in the sense amplifier regions, and accordingly, bit line bridge defects are relatively common. As such, the memory device is thoroughly tested after manufacture for the presence of bit line bridge defects, and techniques are known for replacing defective bit lines with spare bit lines.

One problem with testing for bit line bridge defects, however, is that it is becoming increasingly difficult to distinguish bit line leakage from the leakage of the sense amplifier. As mentioned above, sense amplifier leakage causes a gradual drop in ΔVBL. The leakage attended by a bit line bridge defect can similarly reduce ΔVBL. Accordingly, it has become to difficult identify bit line bridge defects, particularly in the case where low threshold sense amplifier transistors are utilized.

SUMMARY OF THE INVENTION

According to one aspect of the present invention, a semiconductor memory device is provided which is operative in a read mode to read a memory cell of the device and which includes first and second memory cell arrays, a sense amplifier, and first and second isolation circuits. The first memory cell array includes a first memory cell to be read, a first bit line pair and a first word line, where a charge contained in the first memory cell to be read is applied to the first bit line pair when a word line select signal applied to the first word line becomes active during the read mode. The second memory cell array includes a second memory cell, a second bit line pair and a second word line. The sense amplifier is operatively interposed between the first and second memory cell arrays. The first isolation circuit isolates the sense amplifier from the first bit line pair when a first isolation signal is active, and couples the first bit line pair and the sense amplifier when the first isolation signal is inactive. The second isolation circuit isolates the sense amplifier from the second bit line pair when a second isolation signal is active, and couples the second bit line pair and the sense amplifier when the second isolation signal is inactive. During the read mode, the first isolation signal is held active and the second isolation signal is held inactive prior to the word line select signal becoming active.

According to another aspect of the present invention, a semiconductor device is provided which includes first and second memory cell arrays, a sense amplifier operatively interposed between the first and second memory cell arrays, first and second isolation circuits, an external terminal, and a logic circuit. The first isolation circuit isolates the sense amplifier from the first bit line pair when a first isolation signal is active, and couples the first bit line pair and the sense amplifier when the first isolation signal is inactive. The second isolation circuit isolates the sense amplifier from the second bit line pair when a second isolation signal is active, and couples the second bit line pair and the sense amplifier when the second isolation signal is inactive. The external terminal receives an external isolation control signal, and the logic circuit receives the external isolation control signal and outputs the first and second isolation signals.

According to yet another aspect of the present invention, a semiconductor memory device is provided which includes a first memory cell array including a first bit line pair, a first equalization circuit coupled to the first bit line pair, a second memory cell array including a second bit line pair, a second equalization circuit coupled to the second bit line pair, a sense amplifier operatively interposed between the first and second bit line pairs, first and second isolation circuits, an external terminal, a control circuit, and a logic circuit. The first isolation circuit isolates the sense amplifier from the first bit line pair when a first isolation signal is active, and couples the sense amplifier to the first bit line pair when the first isolation signal is inactive. The second isolation circuit isolates the sense amplifier from the second bit line pair when a second isolation signal is active, and couples the second bit line pair to the sense amplifier when the second isolation signal is inactive. The external terminal receives an external isolation control signal, the control circuit which outputs a memory array selection signal, and the logic circuit which receives the external isolation control signal and the memory array selection signal and which outputs the first and second isolation signals.

According to another aspect of the present invention, a semiconductor memory is provided which includes a memory cell array, a sense amplifier, an isolation device interposed between the sense amplifier and a bit line of the memory cell array, and means for transferring a charge contained in a memory cell of memory cell array to the bit line while the isolation device electrically isolates the bit line from the sense amplifier, and, after the charge is transferred to the bit line, for causing the isolation device to electrically connect the bit line to the sense amplifier.

According to still another aspect of the present invention, a method of reading a memory cell in a semiconductor memory is provided. The semiconductor memory include a first bit line pair and a first memory cell to be read, a second memory cell array including a second bit line pair, a sense amplifier operatively interposed between the first and second bit line pairs, a first isolation circuit which isolates the sense amplifier from the first bit line pair when a first isolation signal is active, and which couples the first bit line pair and the sense amplifier when the first isolation signal is inactive, and a second isolation circuit which isolates the sense amplifier from the second bit line when a second isolation signal is active, and which couples the first bit line and the sense amplifier when the second isolation signal is inactive. The method includes causing the first isolation signal to be active and the second isolation signal to be inactive, applying a charge contained in the first memory cell to be read to the first bit line pair while the first isolation signal is active and the second isolation signal is inactive, and causing the first isolation signal to be inactive and the second isolation signal to be active after the charge is applied to the first bit line pair, where the charge is applied to the sense amplifier via the first isolation circuit.

According to another aspect of the present invention, a method of reading a semiconductor memory is provided. The semiconductor memory a memory cell array, a sense amplifier, and an isolation device interposed between the sense amplifier and a bit line of the memory cell array. The method includes transferring a charge contained in a memory cell of memory cell array to the bit line while the isolation device electrically isolates the bit line from the sense amplifier, and, after the charge is transferred to the bit line, causing the isolation device to electrically connect the bit line to the sense amplifier.

BRIEF DESCRIPTION OF THE DRAWINGS

The above and other aspects and features of the present invention will become readily apparent from the detailed description that follows, with reference to the accompanying drawings, in which:

FIGS. 14 and 15 are logic tables for describing the operation of the circuit illustrated in FIG. 13;

DETAILED DESCRIPTION OF PREFERRED EMBODIMENTS

The present invention will now be described in detail with reference to preferred but non-limiting embodiments.

Figure 13:
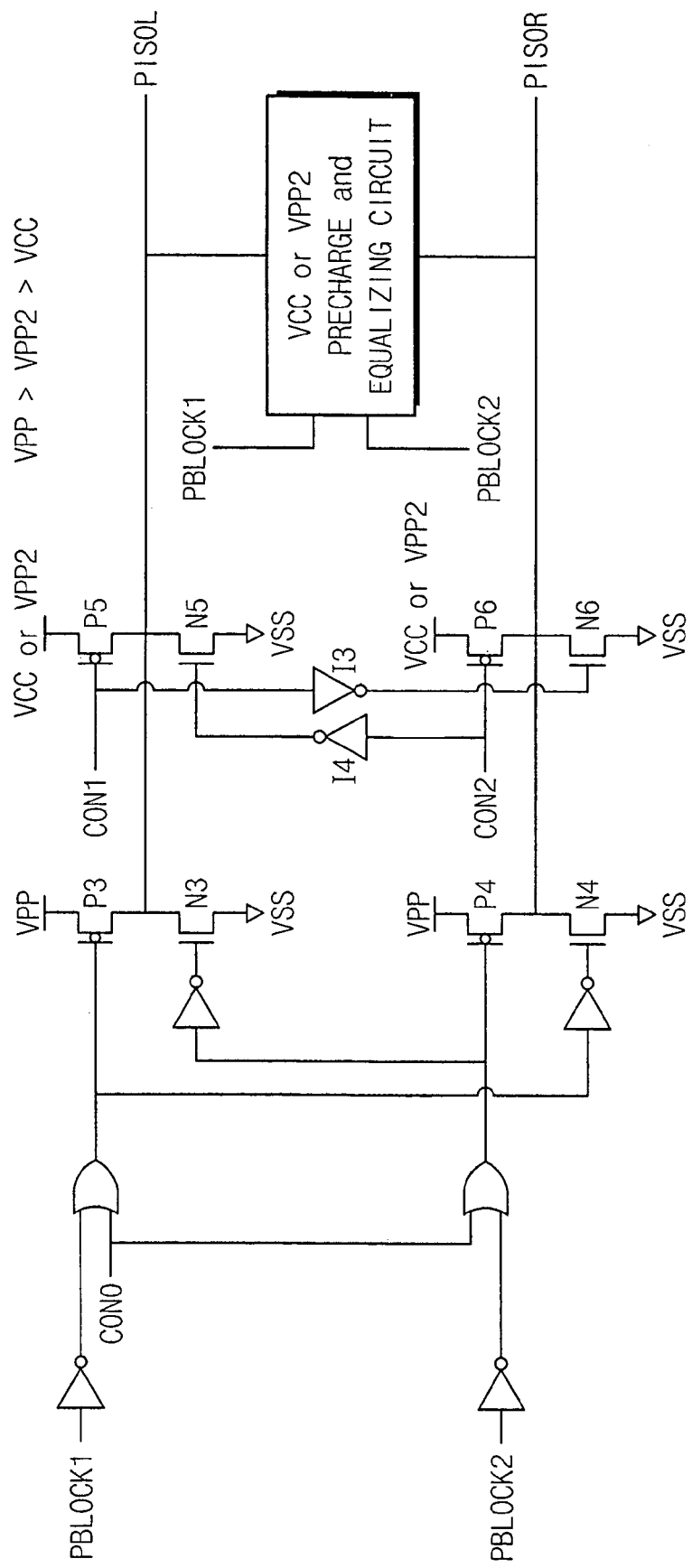
FIG. 13 is a circuit diagram of an isolation control signal generator according to an embodiment of the present invention.

FIG. 13 is a circuit diagram of an isolation control signal generator according to one embodiment of the present invention. Inputs to the generator include the block selection signals PBLOCK1 and PBLOCK2, and control signals CON0, CON1 and CON2. The block selection signals PBLOCK1 and PBLOCK2 may, for example, be generated in the same manner as discussed previously in connection with the related art. The control signals CON0, CON1 and CON2 may, for example, be externally generated and applied to one or more pin terminals or pad terminals of the memory device.

Figures 5, 6:
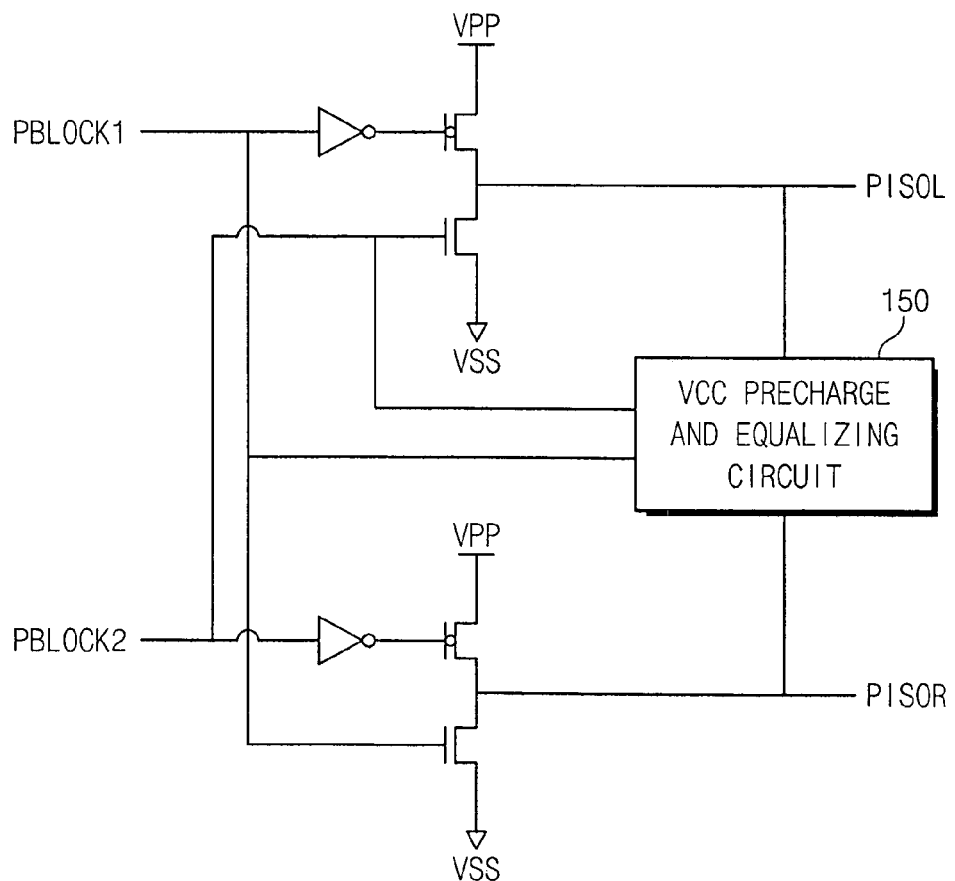
FIGS. 5 and 6 are a circuit diagram and logic table, respectively, for explaining the generation of isolation control signals in a conventional memory device.
Figure 7:
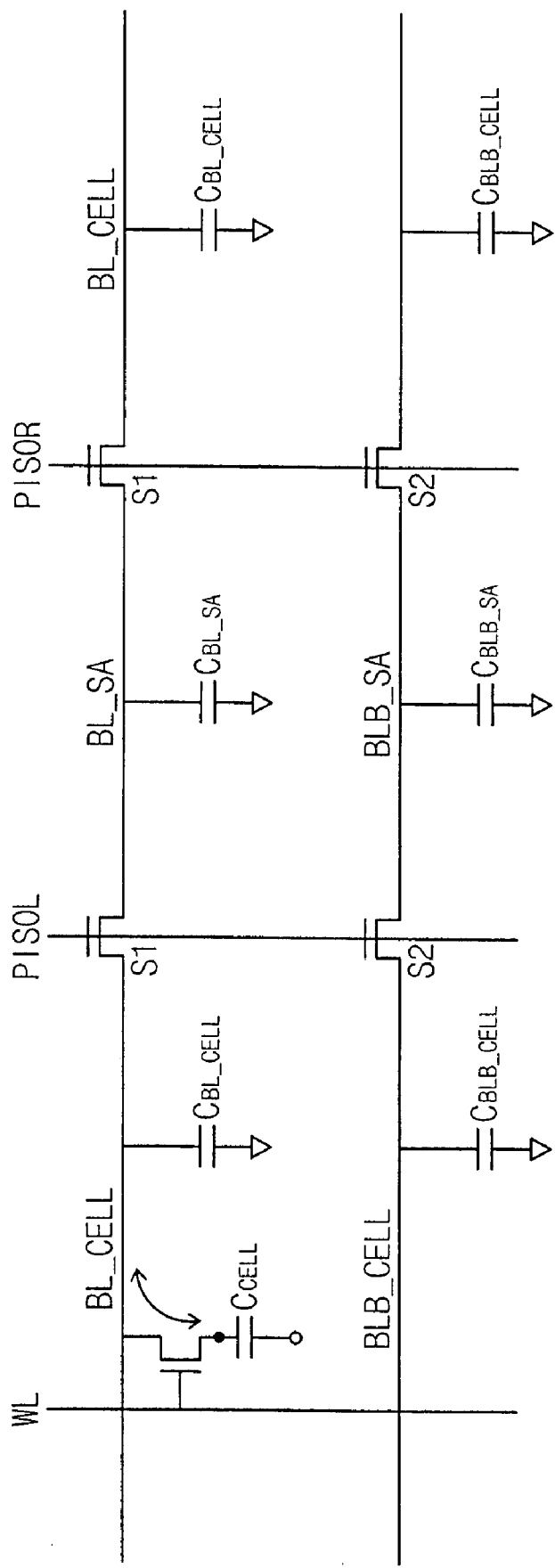
FIGS. 7 and 8 are a circuit diagram and a timing diagram, respectively, for explaining a conventional charge sharing operation.
Figure 8:
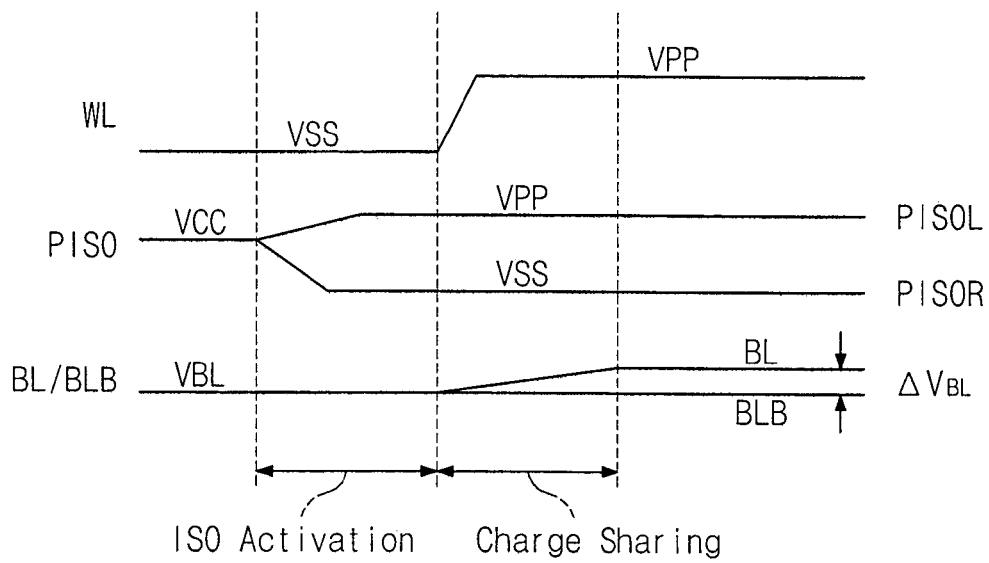
Figure 9:
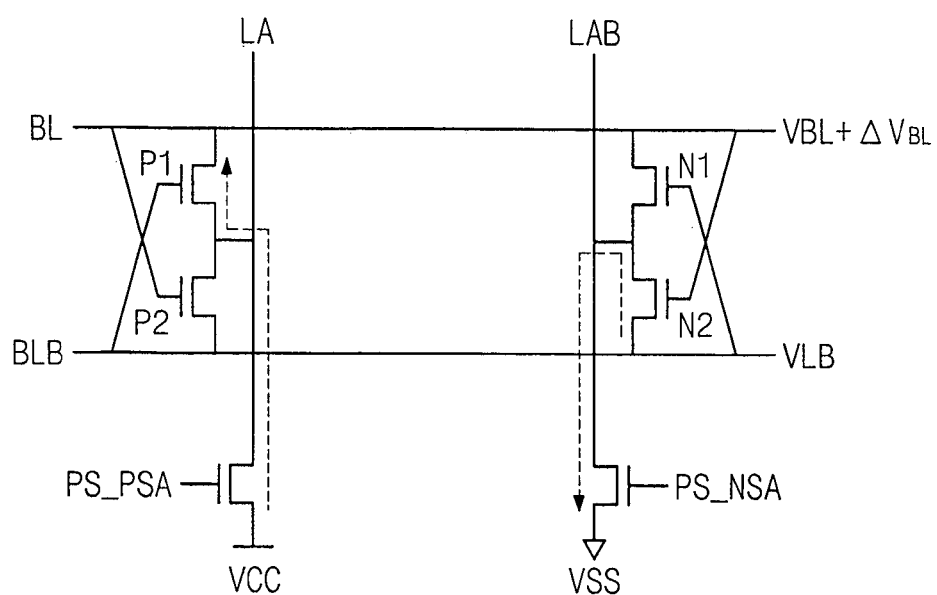
FIG. 9 is a circuit diagram for explaining leakage which occurs in the case of a conventional sense amplifier.
Figure 10:
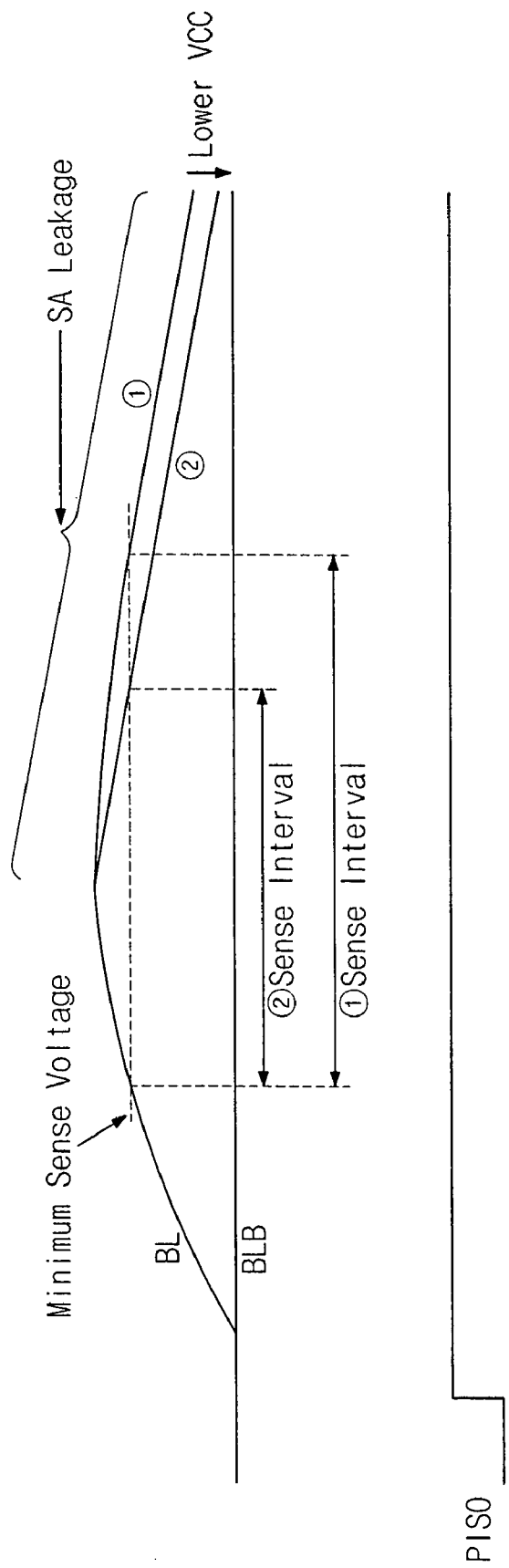
FIG. 10 is a waveform diagram for explaining the relationship between bit line voltage and the sense interval of a conventional memory device.

As shown in FIG. 13, the logic OR of control signal CON0 and inverted block selection signal PBPLOCK1 is applied to the gate of transistor P3, and the inverted signal thereof is applied to the gate of transistor N4. Similarly, the logic OR of control signal CON0 and inverted block selection signal PBPLOCK2 is applied to the gate of transistor P4, and the inverted signal thereof is applied to the gate of transistor N3. Accordingly, when the control signal CON0 is Low, the isolation control signals PISOL and PISOR are dependent on the block selection signals PBLOCK1 and PBLOCK2 in the same manner as described previously in connection with FIGS. 5 and 6.

On the other hand, when CON0 is High, the transistors P3, N3, P4 and N4 are all maintained in an OFF state regardless of the block selection signals PBLOCK1 and PBLOCK2. As such, the isolation control signals PISOL and PISOR become dependent on the control signals CON1 and CON2. That is, when CON1 is High and CON2 is Low, transistors P5 and N6 are OFF, and transistors N5 and P6 are ON. The isolation control signal PISOL thus becomes VSS, and the isolation control signal PISOR becomes VCC or VPP2. Here, VPP>VPP2>VCC. As examples only, VPP≈2.1v, VPP2≈1.4v, and VCC≈1.0v. In contrast, when CON1 is Low and CON2 is High, transistors P5 and N6 are ON, and transistors N5 and P6 are Off. The isolation control signal PISOL thus becomes VCC or VPP2, and the isolation control signal PISOR becomes VSS.

The operation of the isolation control signal generator of FIG. 13 is summarized in the logic tables of FIGS. 14 and 15. As shown in FIG. 14, when the control signal CON0 is Low, the circuit operates in a normal operating mode which may, for example, be the same as that of the conventional memory device already discussed. On the other hand, when the control signal CON0 is High, the normal operational mode is effectively blocked, and the external control mode is activated. That is, as shown in FIG. 15, when CON0 is High, and CON1 is Low and CON2 is High, the isolation control signal PISOL is enabled (High at VCC or VPP2). In contrast, when CON0 is High, and CON1 is High and CON2 is Low, the isolation control signal PISOR is enabled (High at VCC or VPP2).

Figure 16:
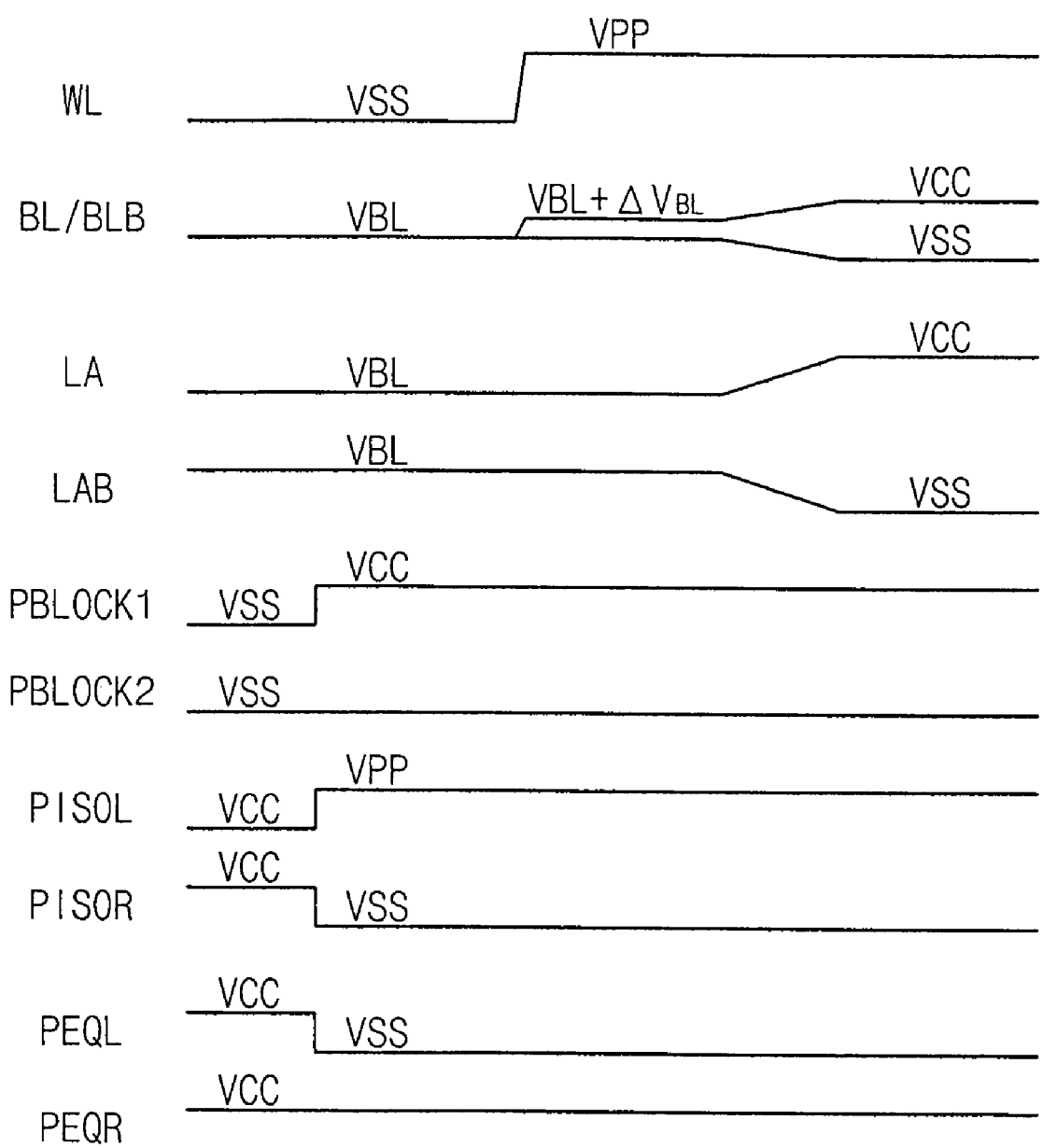
FIG. 16 is a timing diagram for describing a first operational mode of a memory device according to an embodiment of the present invention.

A timing diagram of the normal operational mode (where control signal CON0 is Low) is illustrated in FIG. 16. Initially, in a standby state, signals PBLOCK1 and PBLOCK2 are Low (VSS), which means that isolation control signals PISOL and PISOR are at VCC (see the table of FIG. 6). Also, in this state, equalization control signals PEQL and PEQR are held at VCC.

Figure 1:
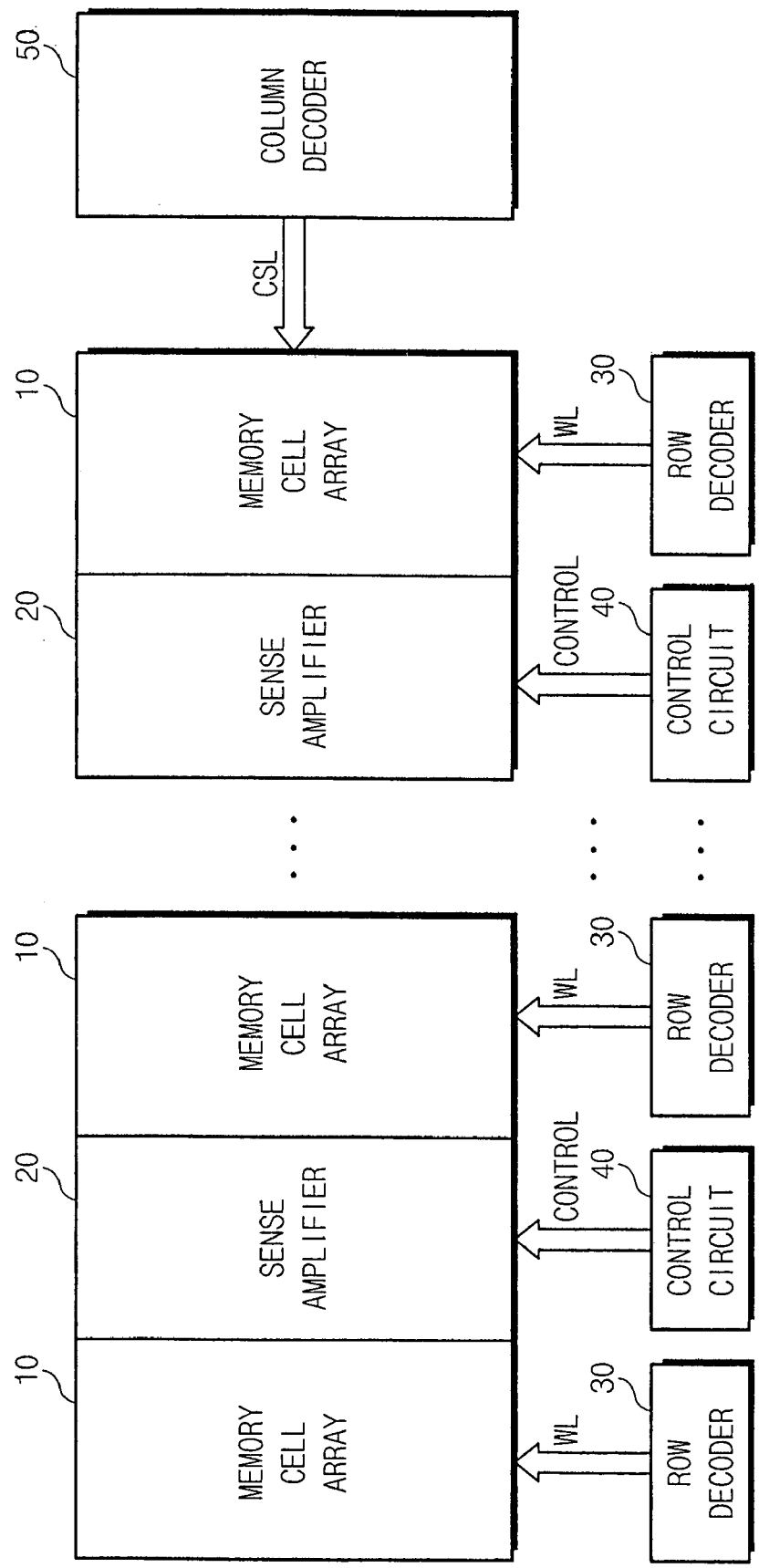
FIG. 1 is a block diagram of a conventional memory device.
Figure 2:
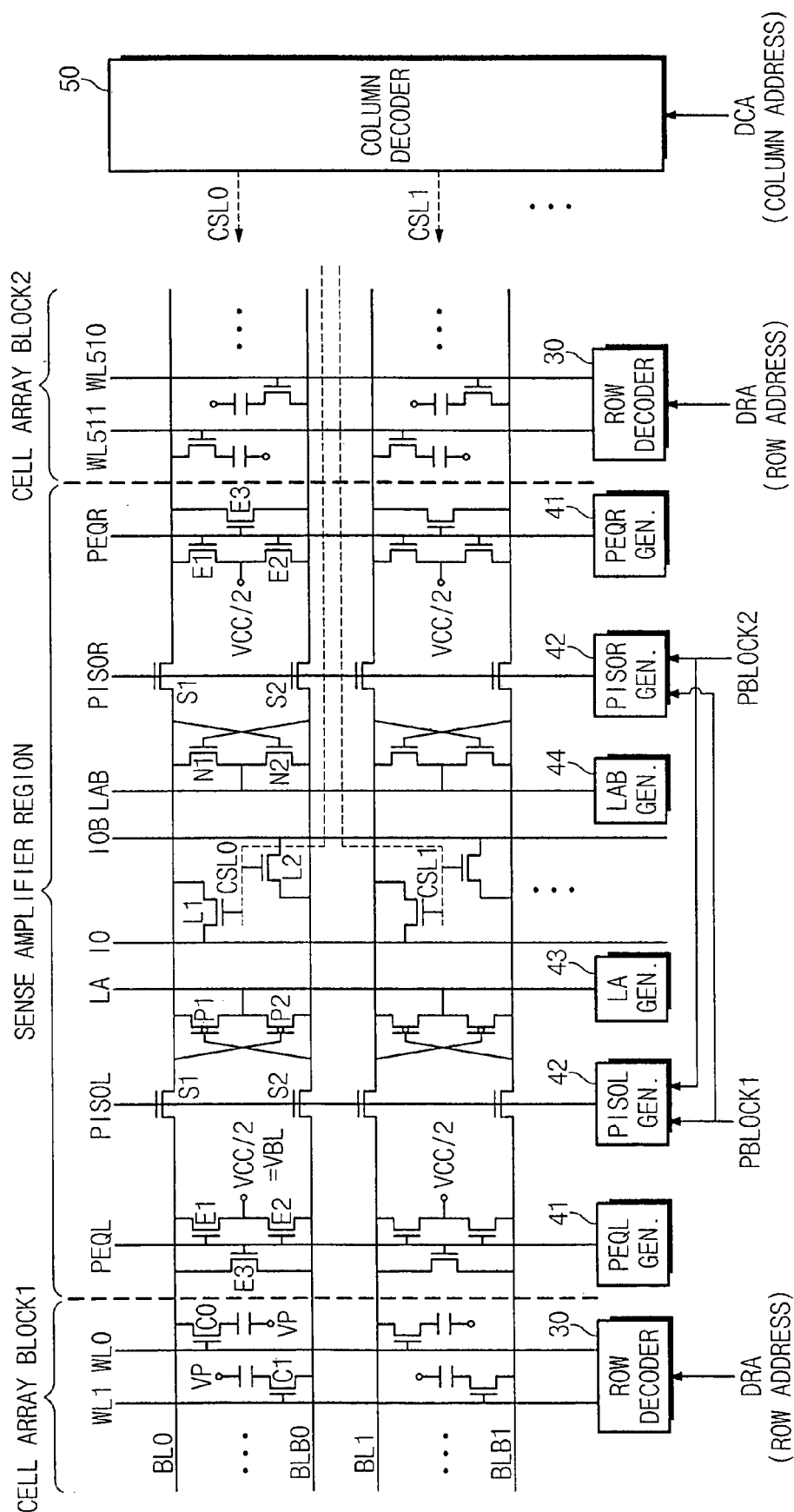
FIG. 2 is a circuit diagram of a portion of the memory device illustrated in FIG. 1.
Figure 3:
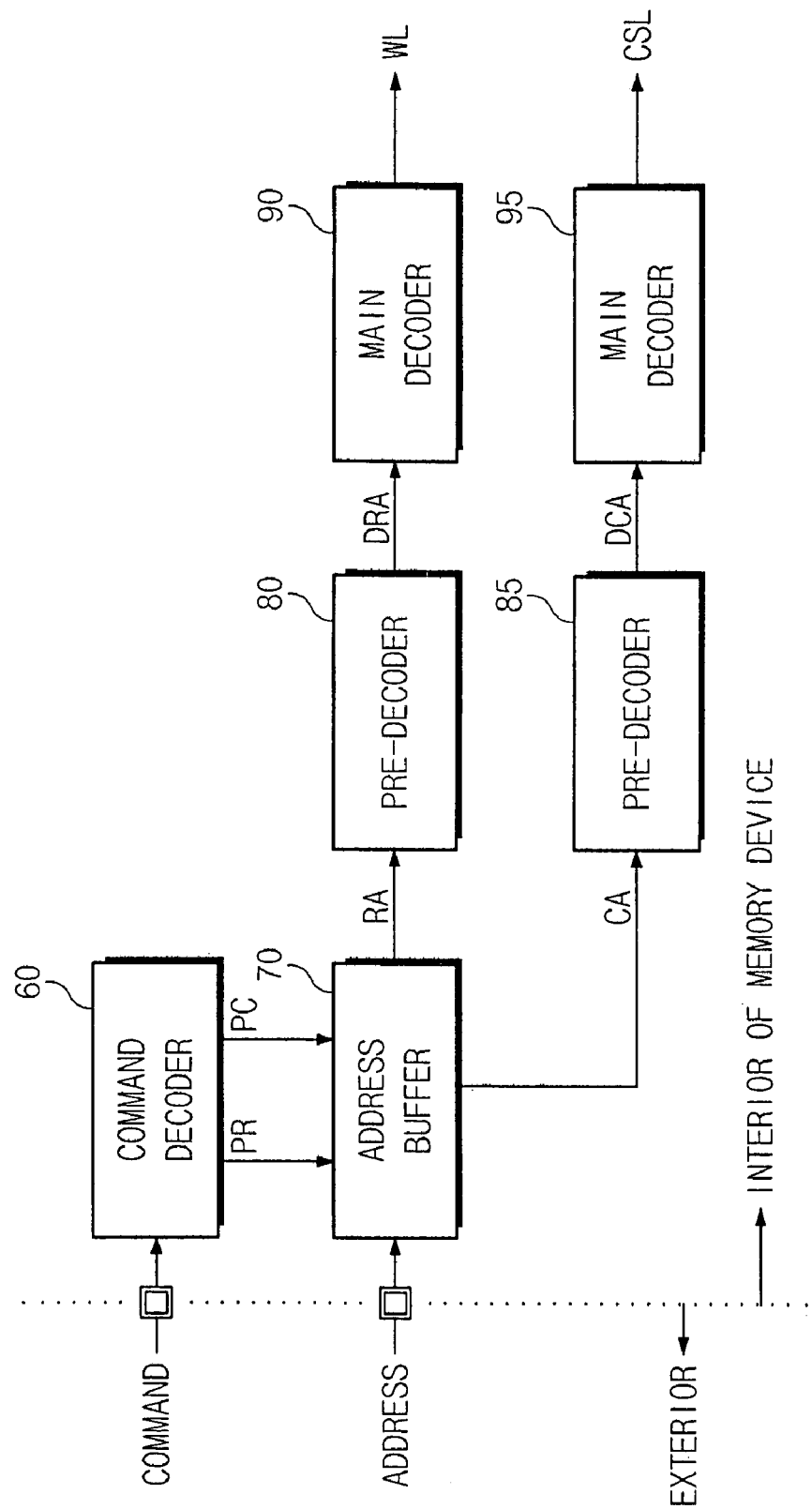
FIG. 3 is a block diagram of conventional circuitry used to generate word line and column select signals.
Figure 4:
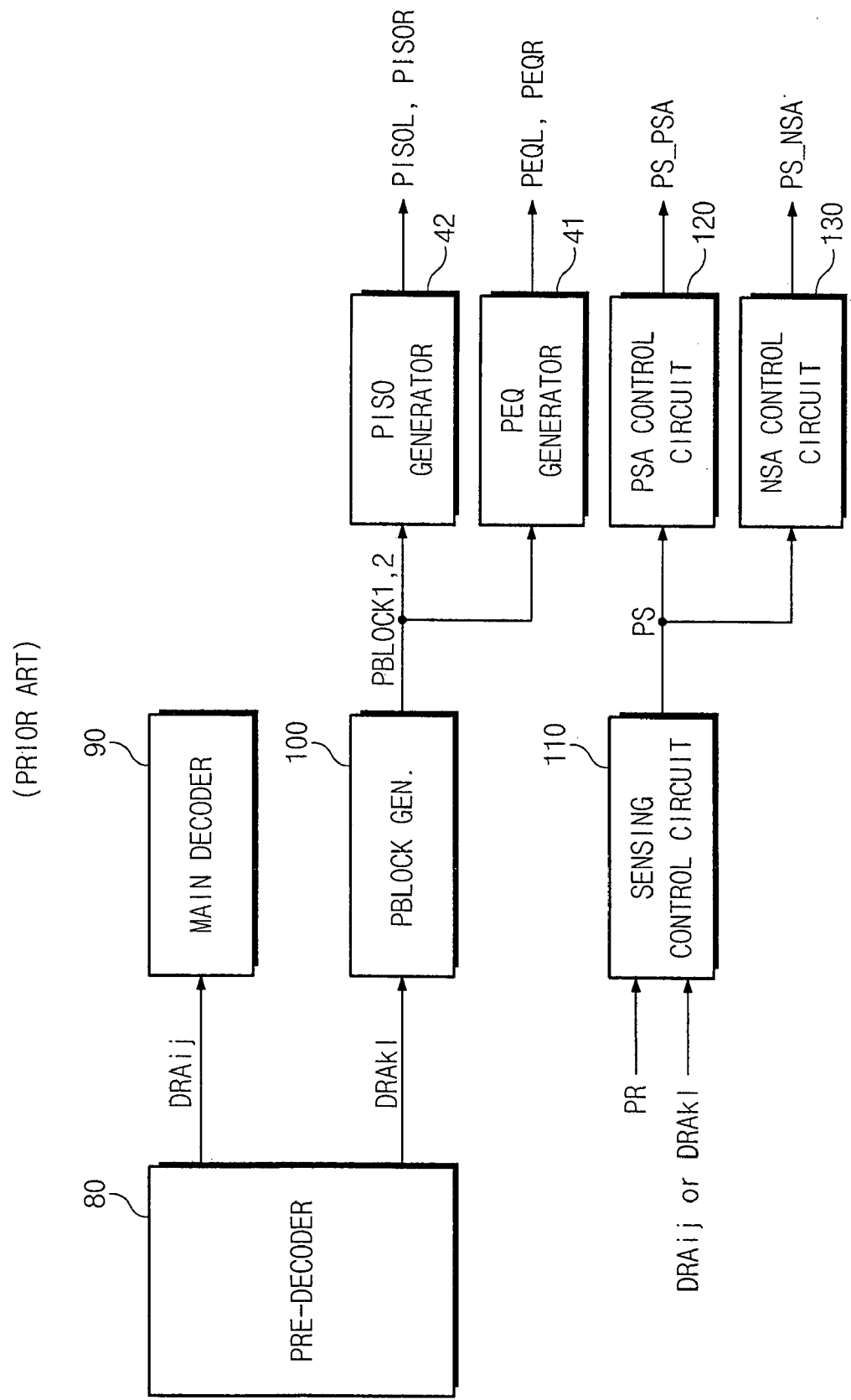
FIG. 4 is a block diagram of conventional circuitry used to generate isolation, equalization and sense enable signals.

Then, block selection signal PBLOCK1 goes to VCC. Referring to FIG. 13, this causes isolation control signal PISOL to go High (VPP) and isolation control signal PISOR to go Low (VSS). As such, the memory array block 1 is connected to the sense amplifier (see FIG. 2), and the memory array block 2 is isolated from the sense amplifier. In addition, equalization control signal PEQL goes Low (VSS), thus deactivating the equalization and pre-charge circuit on the side of the memory array block 1.

Next, the word line signal WL is raised from Low (VSS) to High (VPP). As a result, a charge sharing operation causes the voltage of bit line BL to be raised to VBL+ΔVBL (it is assumed here that a memory cell connected to bit line BL contains a charge representing a data "1"). During this state, the sense interval of the sensing operation occurs as discussed previously.

Then, the sense enable voltage LA is increased from VBL to VCC and the sense enable voltage LAB is decreased from VBL to VSS. As such, the voltage of bit line BL becomes VCC and the voltage of bit line BLB becomes VSS.

The normal operational mode of FIG. 16 is the same as that found in the conventional memory device as discussed previously. However, when screening for defective bit lines, it is difficult to discriminate the voltage behavior of defective bit lines from the voltage characteristics resulting from leakage in the sense amplifier circuitry. Accordingly, this embodiment of the present invention is configured to run in the externally controlled operational mode as shown in the timing diagram of FIG. 17.

Figure 17:
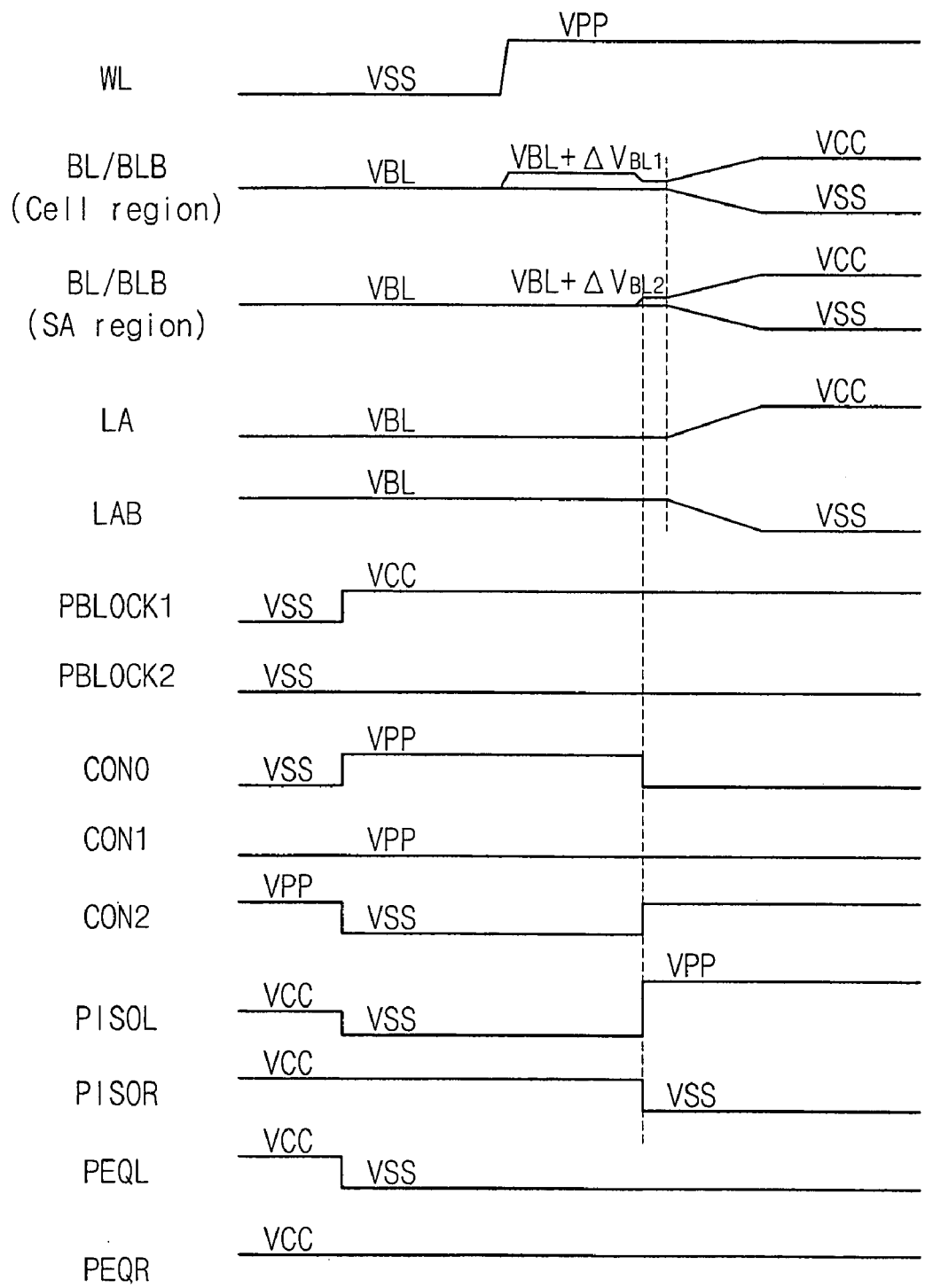
FIG. 17 is a timing diagram for describing a second operational mode of a memory device according to an embodiment of the present invention.

Referring to FIG. 17, in an initial state, block selection signals PBLOCK1 and PBLOCK2 are at VSS (Low), control signal CON0 is at VSS (Low), control signals CON1 and CON2 are at VPP (High), isolation control signals PISOL and PISOR are at VCC, and equalization control signals PEQL and PEQR are at VCC.

Then, upon the selection of memory block 1, the block selection signal PBLOCK1 goes to VCC, control signal CON0 goes to VPP, control signal CON2 goes to VSS, and PISOL goes to VSS. See FIG. 13. In this state, referring to FIG. 2, the memory block 1 is isolated from the sense amplifier by the isolation transistor (connected to PISOL) on the left side of the sense amplifier region, and the equalization circuit (connected to PEQL) connected ton the left side of the sense amplifier region is deactivated. Further, the sense amplifier is allowed to be pre-charged by the equalization circuit (connected to PEQR) on the right side of the sense amplifier region via the other isolation transistor (connected to PISOR).

Figure 11:
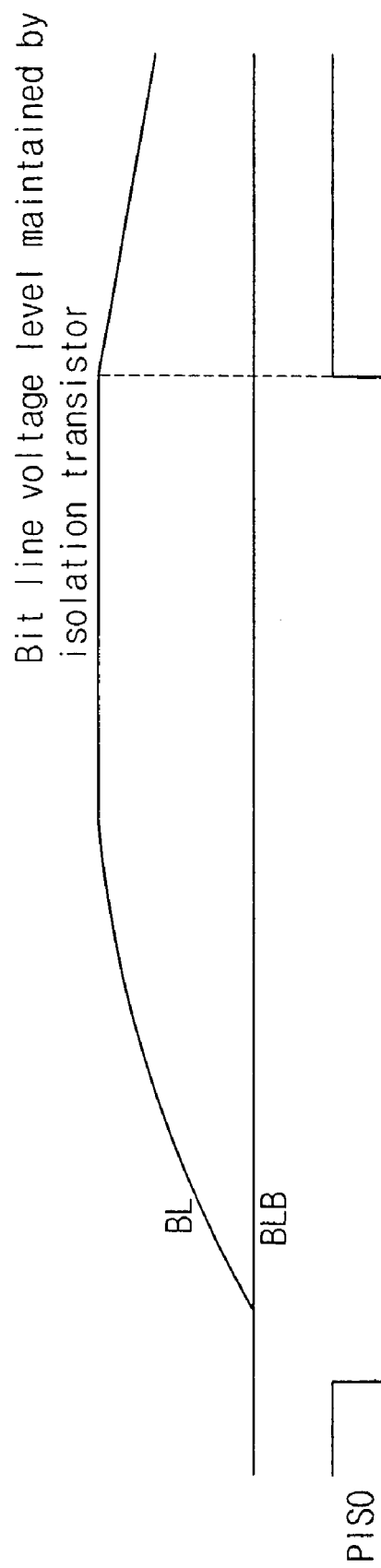
FIG. 11 is a waveform diagram for explaining the control of the bit line voltage according to an isolation technique of an embodiment of the present invention.
Figure 12:
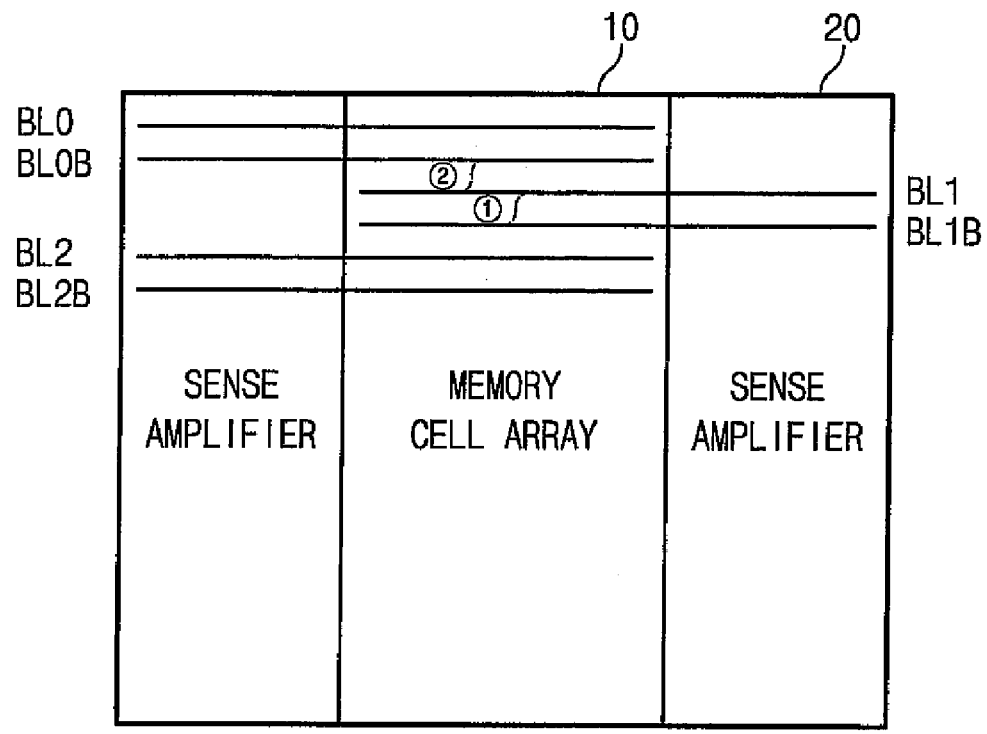
FIG. 12 is a block diagram illustrating bit line bridge defects which can occur in a conventional memory device.

Next, the word line signal WL is raised from Low (VSS) to High (VPP). As a result, a charge sharing operation causes the voltage of bit line BL of the memory block to be raised to VBL+ΔVBL (it is assumed here that a memory cell connected to bit line BL contains a charge representing a data "1"). Note, however, that since the sense amplifier is isolated from the memory block 1, the voltage of the bit line BL of the memory block does not fall as a result of leakage of the sense amplifier. This is illustrated in FIG. 11, where the bit line BL voltage is maintained until the isolation control signal PISO is increased to a high voltage level. In the meantime, the voltage of the bit line BL at the sense amplifier remains at VBL as shown in FIG. 17.

After the charge is transferred to the bit line BL in the cell region of the memory block 1, but prior to enabling of the sense amplifier, the control signal CON0 goes to VSS (Low) and the control signal CON2 goes to VPP (High). This causes the isolation control signal PISOL to become VPP (High) and the isolation control signal PISOR to become VSS. As such, again referring to FIG. 2, the isolation transistor (connected to PISOL) electrically connects the bit line BL of the memory block 1 to the sense amplifier, and the other isolation transistor (connected to PISOR) electrically isolates the second memory block 2 from the sense amplifier. As such, the memory cell charge previously transferred to the bit line BL of the memory block is further transferred to the sense amplifier. Charge sharing results in an increase of the voltage of the bit line BL in the sense amplifier region to increase to VBL+ΔVBL2. Likewise, the voltage of the bit line BL in the cell region of the memory block 1 decreases to VBL+ΔVBL2.

Next, the sense amplifier is enabled by the sense enable signal LA increasing from VBL to VCC, and by the sense enable signal LAB decreasing from VBL to VSS. As a result, the voltage of the bit line BL becomes VCC, and the voltage of the bit line BLB becomes VSS.

The operational mode of FIG. 17 is at least partially characterized by the delayed activation of the isolation transistor after charge has been transferred to the bit line BL within the memory block 1. As a result, the amount of time in which the leakage current of the sense amplifier can impact the bit line voltage is substantially reduced. In other words, the short time period between activation of the isolation transistor and enablement of the sense amplifier does not allow for the sense amplifier leakage to be a factor when testing the bit line.

Figure 18:
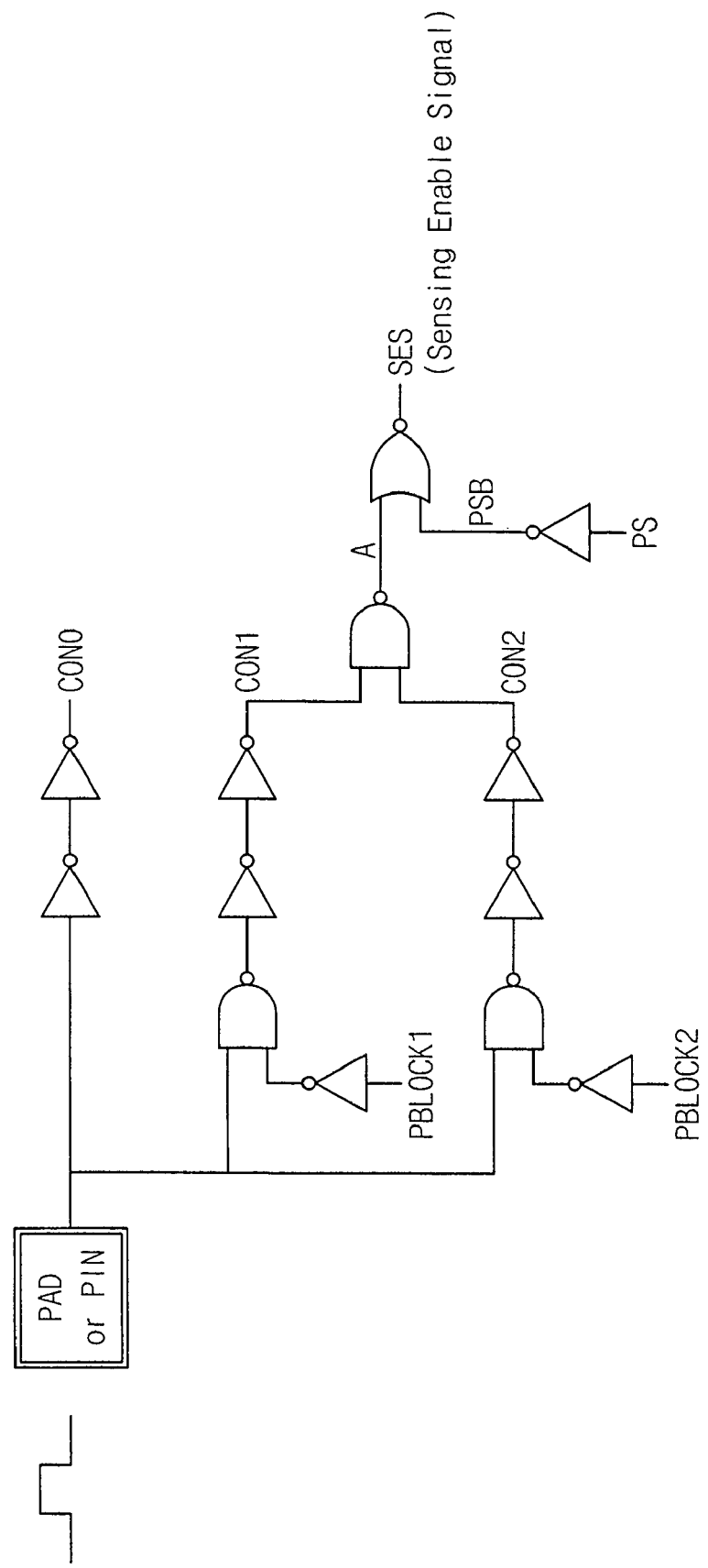
FIG. 18 is a logic circuit diagram showing the generation of a sense enable signal and control signals according to an embodiment of the present invention.
Figure 19:
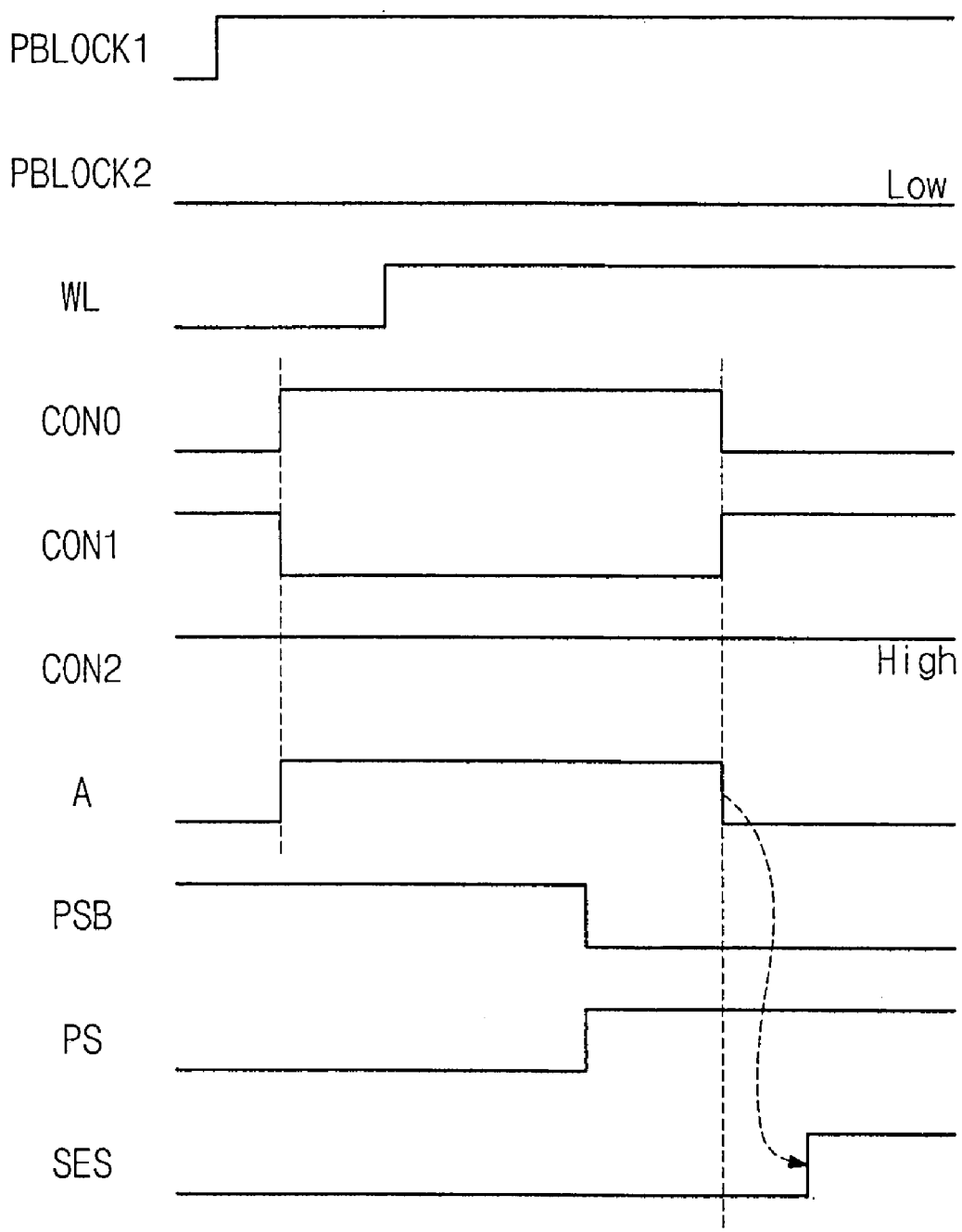
FIG. 19 is a timing diagram for explaining the operation of the logic circuit illustrated in FIG. 20.

FIG. 18 is a diagram of a circuit which may be used to generate the control signals CON0, CON1 and CON2, and the sense enable signal SES, and FIG. 19 is a timing diagram showing the operation of the same. When the first block 1 is selected (i.e., PBLOCK1 is High, and PBLOCK2 is Low), and control signal CON0 becomes High, then CON1 becomes Low and CON2 remains High. As a result, node A becomes High. Then, sense enable signal PS goes High and inverted sense enable signal PSB goes Low. Thereafter, when control signal CON0 goes Low, the control signal CON1 goes High, causing node A to become Low. Then, after a delay caused by the NOR gate of FIG. 18, the sense enable signal SES goes High. This delay corresponds to the timing between the two vertical dashed lines appearing in FIG. 17.

Figure 20:
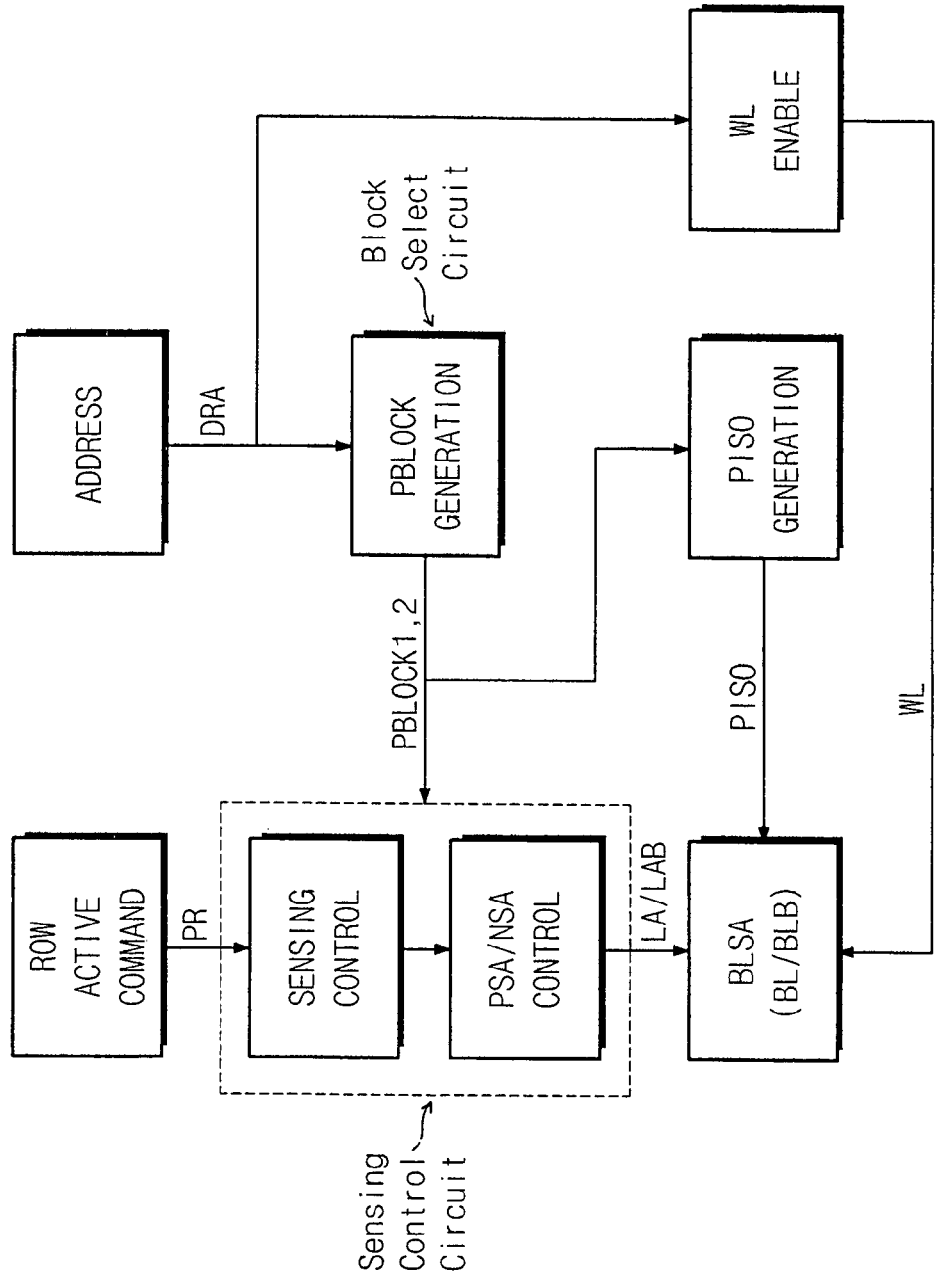
FIG. 20 is an operational block diagram of the first operational mode of a memory device according to an embodiment of the present invention.

FIG. 20 is a functional block diagram of the normal operation mode of an embodiment of the present invention. As explained previously, the normal operational mode may be the same as that of the related art. In this case, the address DRA is used to control the PBLOCK signal generation and to enable the word WL. The PBLOCK signals are used to control the isolation control signal PISO generation. In addition, the PBLOCK signals, together with the row active command PR, are used to control the sensing control circuit. The sensing control circuit includes a sensing control block which is responsive to the row active command PR, and a PSA/NSA control circuit that is responsive to the sensing control block. Finally, the bit line sense amplifier BLSA is controlled according to the sense amplification lines LA and LAB, the isolation control signal PISO, and the word line signal WL.

Figure 21:
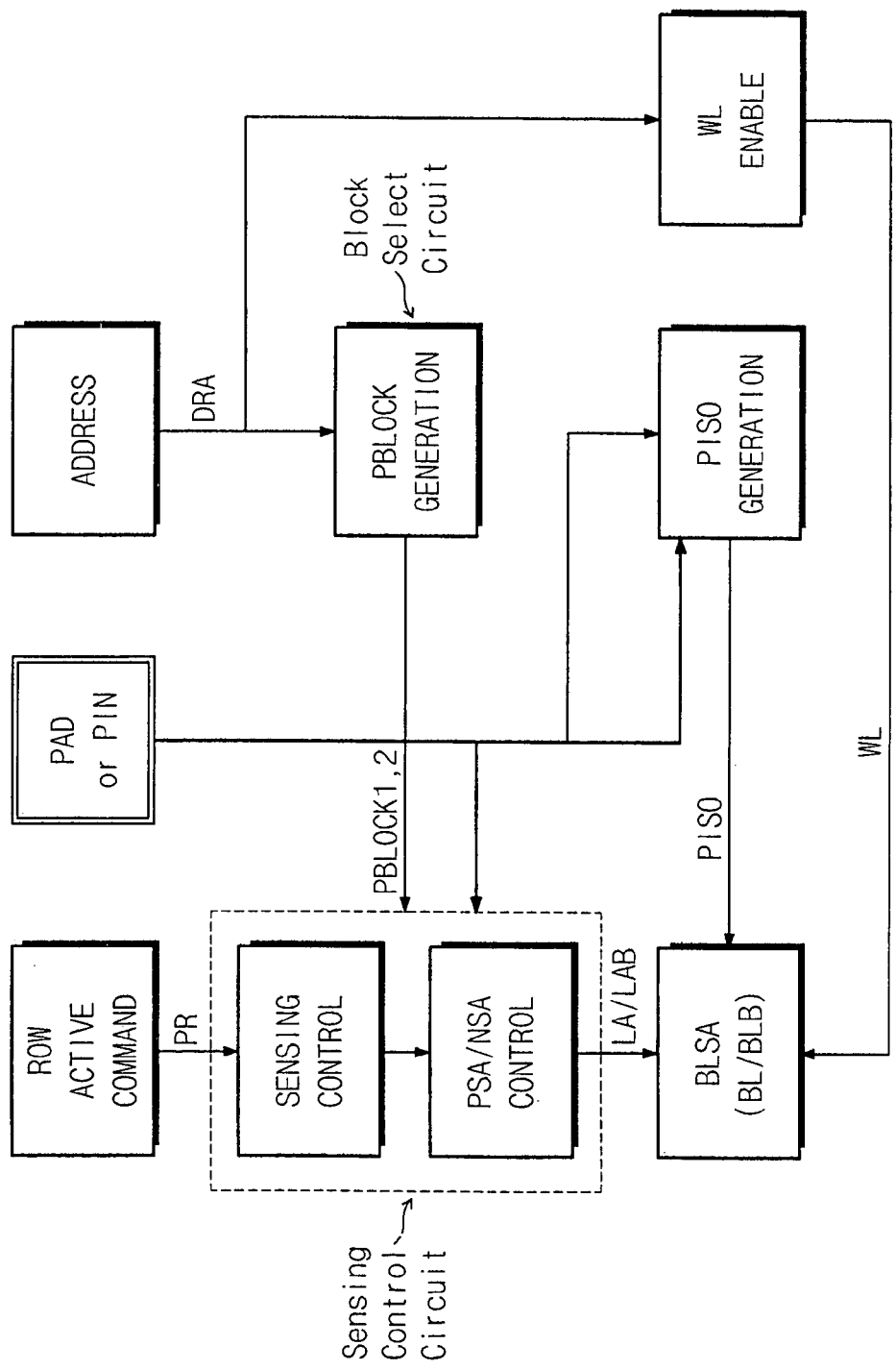
FIG. 21 is an operational block diagram of the second operational mode of a memory device according to an embodiment of the present invention.

FIG. 21 is a functional block diagram of the externally controlled operational mode of an embodiment of the present invention. As illustrated, this mode is similar to that of FIG. 20, except that the isolation control signal PISO generation is selectively controlled base on an external control signal received from a PAD or PIN terminal. In addition, the sensing control circuit is selectively controlled according to this external control signal.

As described above, embodiments of the present invention delay activation of the isolation transistor until after a memory charge has already been transferred to the bit line within the memory block of the memory cell. As a result, the amount of time in which the leakage current of the sense amplifier can impact the bit line voltage is substantially reduced. The short time period between activation of the isolation transistor and enablement of the sense amplifier does not allow for sense amplifier leakage to be a factor when testing the bit line.

In addition, embodiments of the present invention include an external pad terminal or pin terminal control of the isolation control signal. This allows for user-friendly isolation and sensing control.

Although the present invention has been described above in connection with the preferred embodiments thereof, the present invention is not so limited. Rather, various changes to and modifications of the preferred embodiments will become readily apparent to those of ordinary skill in the art. Accordingly, the present invention is not limited to the preferred embodiments described above. Rather, the true spirit and scope of the invention is defined by the accompanying claims.

What is claimed is:

1. A semiconductor memory device which is operative in a read mode to read a memory cell of the device, comprising:
a first memory cell array including a first memory cell to be read, a first bit line pair and a first word line, wherein a charge contained in the first memory cell to be read is applied to the first bit line pair when a word line select signal applied to the first word line becomes active during the read mode;
a second memory cell array including a second memory cell, a second bit line pair and a second word line;
a sense amplifier operatively interposed between the first and second memory cell arrays;
a first isolation circuit which isolates the sense amplifier from the first bit line pair when a first isolation signal is active and which couples the first bit line pair and the sense amplifier when the first isolation signal is inactive;
a second isolation circuit which isolates the sense amplifier from the second bit line pair when a second isolation signal is active, and which couples the second bit line pair and the sense amplifier when the second isolation signal is inactive;
wherein, during the read mode, the first isolation signal is held active and the second isolation signal is held inactive prior to the word line select signal becoming active.

2. The semiconductor device of claim 1, wherein, during the read mode, the first isolation signal becomes inactive and the second isolation signal becomes active after the word line select signal becomes active such that the charge applied to the first bit line pair is further applied to the sense amplifier.

3. The semiconductor device of claim 1, further comprising:
a first equalization circuit which equalizes a potential of the first bit line pair when a first equalization control signal is active;
a second equalization circuit which equalizes a potential of the second bit pair line when a second equalization control signal is active;
wherein, during the read mode, the second equalization control signal is inactive while the second isolation signal is held active such that the second equalization circuit pre-charges the sense amplifier during the read mode.

4. The semiconductor device of claim 1, wherein the read mode is a test mode for testing the memory cell to be read.

5. The semiconductor device of claim 1, wherein the semiconductor device is a dynamic random access memory (DRAM).

6. A semiconductor device, comprising:
first and second memory cell arrays having respective first and second bit line pairs;

a sense amplifier operatively interposed between the first and second memory cell arrays;

a first isolation circuit which isolates the sense amplifier from the first bit line pair when a first isolation signal is active, and which couples the first bit line pair and the sense amplifier when the first isolation signal is inactive;

a second isolation circuit which isolates the sense amplifier from the second bit line pair when a second isolation signal is active, and which couples the second bit line pair and the sense amplifier when the second isolation signal is inactive;

an external terminal which receives an external isolation control signal; and a logic circuit which receives the external isolation control signal and outputs the first and second isolation signals wherein, during a read mode of the semiconductor device, the first isolation signal is held active and the second isolation signal is held inactive prior to a word line select signal becoming active.

7. The semiconductor device of claim 6, wherein the logic circuit further receives a memory array selection signal indicative of one of the first and second memory arrays.

8. The semiconductor device of claim 7, further comprising command terminals which receive externally supplied command signals, and address terminals which receive externally supplied address signals.

9. The semiconductor device of claim 8, wherein the command terminals and address terminals are pad or pin terminals of the device.

10. The semiconductor device of claim 6, wherein the external terminal is a pad or pin terminal of the device.

11. The semiconductor device of claim 6, further comprising:
a first equalization circuit which equalizes a potential of the first bit line pair when a first equalization control signal is active;
a second equalization circuit which equalizes a potential of the second bit pair line when a second equalization control signal is active;
wherein, during the read mode, the second equalization control signal is active while the second isolation signal is held inactive such that the second equalization circuit pre-charges the sense amplifier during the read mode.

12. The semiconductor device of claim 6, wherein the read mode is a test mode for testing the first bit line pair of the first memory cell array.

13. The semiconductor device of claim 6, wherein the semiconductor device is a dynamic random access memory (DRAM).

14. A semiconductor memory device, comprising:
a first memory cell array including a first bit line pair;
a first equalization circuit coupled to the first bit line pair;
a second memory cell array including a second bit line pair;
a second equalization circuit coupled to the second bit line pair;
a sense amplifier operatively interposed between the first and second bit line pairs;
a first isolation circuit which isolates the sense amplifier from the first bit line pair when a first isolation signal is active, and which couples the sense amplifier to the first bit line pair when the first isolation signal is inactive;
a second isolation circuit which isolates the sense amplifier from the second bit line pair when a second isolation signal is active, and which couples the second bit line pair to the sense amplifier when the second isolation signal is inactive;
an external terminal which receives an external isolation control signal;
a control circuit which outputs a memory array selection signal; and
a logic circuit which receives the external isolation control signal and the memory array selection signal and which outputs the first and second isolation signals wherein the semiconductor device operates in first and second read modes depending on the external isolation control signal,
wherein a charge contained in the first memory cell to be read is applied to the first bit line pair when a word line select signal applied to the first word line becomes active during the first and read modes,
wherein, during the first read mode, the first isolation signal is held inactive and the second isolation signal is held active prior to the word line select signal becoming active, and wherein, during the second read mode, the first isolation signal is held active and the second isolation signal is held inactive prior to the word line select signal becoming active.

15. The semiconductor device of claim 14, wherein the second read mode is a test mode for testing the first bit line pair of first memory cell array.

16. The semiconductor device of claim 14, wherein the first read mode is a normal operation mode of the semiconductor device.

17. A semiconductor memory device, comprising:
a first memory cell array including a first bit line pair;
a first equalization circuit coupled to the first bit line pair;
a second memory cell array including a second bit line pair;
a second equalization circuit coupled to the second bit line pair;
a sense amplifier operatively interposed between the first and second bit line pairs;
a first isolation circuit which isolates the sense amplifier from the first bit line pair when a first isolation signal is active, and which couples the sense amplifier to the first bit line pair when the first isolation signal is inactive;
a second isolation circuit which isolates the sense amplifier from the second bit line pair when a second isolation signal is active, and which couples the second bit line pair to the sense amplifier when the second isolation signal is inactive;
an external terminal which receives an external isolation control signal;
a control circuit which outputs a memory array selection signal; and
a logic circuit which receives the external isolation control signal and the memory array selection signal and which outputs the first and second isolation signals wherein the sense amplifier is operative in response to a sense enable signal, and wherein the semiconductor device includes a second logic circuit which generates the sense enable signal in response to the external isolation control signal.

18. The semiconductor device of claim 17, further including a block signal generator which generates a block selection signal indicative of the selection of one of the first and second memory cell arrays.

19. The semiconductor device of claim 18, wherein the second logic circuit generates the sense enable signal further in response to the block selection signal.

20. A semiconductor memory, comprising:
a memory cell array;
a sense amplifier;
an isolation device interposed between the sense amplifier and a bit line of the memory cell array; and
means for:
transferring a charge contained in a memory cell of the memory cell array to the bit line while the isolation device electrically isolates the bit line from the sense amplifier;
after the charge is transferred to the bit line, causing the isolation device to electrically connect the bit line to the sense amplifier; and
during a read mode of the semiconductor memory, holding the first isolation signal active and the second isolation signal inactive prior to a word line select signal becoming active.

21. The semiconductor memory of claim 20, wherein the semiconductor memory is a dynamic random access memory (DRAM).

22. A method of reading a memory cell in a semiconductor memory, the semiconductor memory including a first memory cell array including a first bit line pair and a first memory cell to be tested, a second memory cell array including a second bit line pair, a sense amplifier operatively interposed between the first and second bit line pairs, a first isolation circuit which isolates the sense amplifier from the first bit line pair when a first isolation signal is active, and which couples the first bit line pair and the sense amplifier when the first isolation signal is inactive, and a second isolation circuit which isolates the sense amplifier from the second bit line when a second isolation signal is active, and which couples the first bit line and the sense amplifier when the second isolation signal is inactive, said method comprising:

causing the first isolation signal to be active;
applying a charge contained in the first memory cell to be read to the first bit line pair while the first isolation signal is active; and
causing the first isolation signal to be inactive and the second isolation signal to be active after the charge is applied to the first bit line pair, wherein the charge is applied to the sense amplifier via the first isolation circuit.

23. The method of claim 22, wherein the semiconductor memory further includes a first equalization circuit which equalizes a potential of the first bit line pair when a first equalization control signal is active, and a second equalization circuit which equalizes a potential of the second bit pair line when a second equalization control signal is active, and wherein said method further comprises causing the first equalization control signal to be inactive while the second isolation signal is held active such that the second equalization circuit pre-charges the sense amplifier while the first isolation signal is active and the second isolation signal is inactive.

24. The method of claim 23, wherein the semiconductor memory is a dynamic random access memory (DRAM).

25. A method of reading a semiconductor memory which includes a memory cell array, a sense amplifier, and an isolation device interposed between the sense amplifier and a bit line of the memory cell array, wherein said method comprises transferring a charge contained in a memory cell of memory cell array to the bit line while the isolation device electrically isolates the bit line from the sense amplifier, and, after the charge is transferred to the bit line, causing the isolation device to electrically connect the bit line to the sense amplifier.

26. The method of claim 25, wherein the semiconductor memory is a dynamic random access memory (DRAM).

* * * * *